(12) United States Patent
Oldenkamp (10) Patent No.: US 12,170,504 B2
(45) Date of Patent: Dec. 17, 2024

(54) SOLAR MODULE, CONNECTION SYSTEM AND SOLAR MODULE SYSTEM

(71) Applicant: SMA Solar Technology AG, Niestetal (DE)

(72) Inventor: Hendrik Oldenkamp, The Hague (NL)

(73) Assignee: Solarnative GmbH, Frankfurt (DE)

( * ) Notice: Subject to any disclaimer, the term of this patent is extended or adjusted under 35 U.S.C. 154(b) by 146 days.

(21) Appl. No.: 16/563,071

(22) Filed: Sep. 6, 2019

(65) Prior Publication Data
US 2019/0393833 A1 Dec. 26, 2019

Related U.S. Application Data

(63) Continuation of application No. PCT/EP2018/055559, filed on Mar. 7, 2018.

(30) Foreign Application Priority Data

Mar. 7, 2017 (DE) ..................... 10 2017 104 782.4

(51) Int. Cl.
*H02S 40/34* (2014.01)
*H01L 31/02* (2006.01)
*H02S 30/10* (2014.01)
*H02S 40/32* (2014.01)

(52) U.S. Cl.
CPC ........ *H02S 40/34* (2014.12); *H01L 31/02013* (2013.01); *H02S 30/10* (2014.12); *H02S 40/32* (2014.12)

(58) Field of Classification Search
CPC .......... H02S 40/34; H02S 40/32; H02S 40/10; H02S 30/10; H01L 31/02013; H01L 31/048; Y02E 10/50
See application file for complete search history.

(56) References Cited

U.S. PATENT DOCUMENTS

| | | | |
|---|---|---|---|
| 5,951,785 A * | 9/1999 | Uchihashi | .............. F24S 25/67 |
| | | | 136/251 |
| 6,462,265 B1 * | 10/2002 | Sasaoka | ............... H01L 31/048 |
| | | | 136/251 |
| 7,238,879 B2 | 7/2007 | Matsushita et al. | |
| 8,993,875 B2 | 3/2015 | Funakoshi | |

(Continued)

FOREIGN PATENT DOCUMENTS

| CN | 201853720 U | 6/2011 |
|---|---|---|
| DE | 102008023108 A1 | 11/2009 |
| DE | 202015102585 U1 | 6/2015 |

OTHER PUBLICATIONS

International Search Report dated May 3, 2018 in connection with International Application PCT/EP2018/055559.

*Primary Examiner* — Devina Pillay (74) *Attorney, Agent, or Firm* — Eschweiler & Potashnik, LLC (57) ABSTRACT

A solar module includes a plurality of solar cells arranged on the front side of a carrier of the solar module is described, wherein a plurality of conductive ribbons electrically contacts the solar cells and extends from the front side to a rear side of the carrier. The carrier is circumferentially surrounded by a frame of the solar module. A connection system includes the solar module and a connection box, which can further be connected to module electronics via a socket of the connection box in order to form a solar module system.

7 Claims, 6 Drawing Sheets

(56) References Cited

U.S. PATENT DOCUMENTS

| | | | |
|---|---|---|---|
| 9,184,326 B2 | 11/2015 | Konishi et al. | |
| 2005/0054244 A1* | 3/2005 | Werner | H02S 40/34 |
| | | | 439/682 |
| 2008/0196350 A1 | 8/2008 | Ruhle | |
| 2010/0275991 A1* | 11/2010 | Chan | H02S 40/32 |
| | | | 439/271 |
| 2011/0017267 A1 | 1/2011 | Lichy et al. | |
| 2012/0216849 A1 | 8/2012 | Cho | |
| 2013/0146118 A1* | 6/2013 | Kelley | H05K 5/02 |
| | | | 136/244 |
| 2015/0162870 A1 | 6/2015 | Beck | |
| 2015/0249425 A1 | 9/2015 | Fukumochi | |
| 2016/0233364 A1 | 8/2016 | Kang | |
| 2016/0380584 A1* | 12/2016 | DeGraaff | H02S 40/34 |
| | | | 29/854 |
| 2017/0366136 A1* | 12/2017 | Feldmann | H01R 24/30 |
| 2017/0373635 A1* | 12/2017 | Perez | H02S 30/10 |
| 2018/0118138 A1* | 5/2018 | Tsukamoto | H01R 4/34 |
| 2020/0066923 A1* | 2/2020 | Aranami | H01L 31/0488 |

\* cited by examiner

Fig. 6

SOLAR MODULE, CONNECTION SYSTEM AND SOLAR MODULE SYSTEM

CROSS REFERENCE TO RELATED APPLICATIONS

This application is a continuation of International Patent Application number PCT/EP2018/055559, filed on Mar. 7, 2018, which claims priority to German Patent Application number 10 2017 104 782.4, filed on Mar. 7, 2017, and is hereby incorporated by reference in its entirety.

FIELD

The disclosure relates to a solar module, a connection system with a solar module, and a solar module system.

BACKGROUND

Photovoltaic systems with solar modules as distributed, renewable energy generation systems are becoming increasingly important and permit sustainable, resource-saving energy generation. In order to achieve competitive generation costs for energy compared to fossil fuels, it is necessary to produce solar modules in particular, but also the power electronics required to convert the generated direct current power into alternating current power for feeding into an energy supply network as cost-effectively as possible.

The routing of electrical connecting cables from the solar cells of the solar modules to the outside represents a particular technical challenge. As a rule, one or more holes are formed in a glass pane, foil or plate to cover or support the solar cells and to lead connecting cables through these holes to the outside. One disadvantage is that the holes are formed in an area of the glass pane or plate that is spaced from the solar cells in order not to damage them, so that this area is not available for power generation. On the other hand, these holes reduce the mechanical strength of the solar module if they have to be inserted into the glass pane or plate.

A further technical challenge is the installation of a junction box on the solar module, in which the connecting cables from the solar cells are connected to a cabling system or to module-related electronics of the photovoltaic system. As a rule, this junction box is mounted on the back of the carrier of the solar module. This carrier has a comparatively high temperature, especially when exposed to intense sunlight, which makes the integration of electronics into the junction box, for example the integration of an inverter, more difficult due to possible overheating or shortens the service life of the inverter.

SUMMARY

The disclosure is directed to a solar module, a connection system with a solar module or a solar module system, which can be produced particularly cost-effectively and which can achieve yield advantages.

In one embodiment, the disclosure relates to a solar module with a large number of solar cells arranged on the front of a carrier of the solar module. A plurality of conductive ribbons contacts the solar cells electrically and extend from the front to the back of the carrier. The carrier is surrounded by a frame of the solar module.

The ribbons are covered on the front side of the solar module by a covering layer which also covers the solar cells. At the edge of the carrier, these ribbons protrude under the top layer and then run around the edge to the back of the carrier. Since it is not necessary to make holes in a cover layer on the solar cells or the carrier in order to provide the solar cells with connecting cables and lead them to the outside, a manufacturing step may be skipped. At the same time, a loss of area for the solar cells is avoided and the mechanical stability of the solar module is increased.

In one embodiment, the frame is formed by an extruded profile and comprises aluminum. However, it is also conceivable to manufacture the frame from another material, in particular from an insulating material such as plastic. If a conductive frame is used, the ribbons can be electrically insulated from the frame by placing an insulating film between the frame and the ribbons.

Another aspect of the disclosure concerns a connection system comprising a solar module described above. A connection box in which a plurality of pins is arranged parallel to each other is arranged on the rear side of the carrier of the solar module. The ribbons of the solar module are each electrically connected to one pin of the majority of pins. The electrical connection between the pins and the ribbons can be a solder connection, a winding connection, a crimp connection or a bond connection. In an advantageous embodiment, the pins each have different lengths. The staggered length of the pins ensures that each ribbon has only one electrical connection to one of the pins. For this purpose, the connection box is placed over the ribbons and one ribbon is bent up to the associated pin and at least partially wound around this pin before a permanent electrical connection is established using the connection methods listed above. After making the connection, the ribbon is shortened appropriately to prevent it from accidentally making a connection to an adjacent pin. In one embodiment, the connection box has webs in which the pins are stored in cuts in the webs. In one embodiment, between connecting areas of neighboring ribbons, there is one such web each. This then ensures that no accidental electrical connection between adjacent pins or adjacent ribbons can occur even if the pins are moved against each other.

In one embodiment, the pins extend into a section of the connection box which is shaped as a socket. In the socket, the ends of the pins then form the contact pins of a plug connection, especially a male plug connection.

After establishing the electrical connection between the ribbons and the pins, the connection box is, in one embodiment, filled with a potting compound at least to the extent that the electrical connections are completely embedded in the sealing compound. In this way, the voltage carrying parts of the connection box can no longer be touched. After casting, the connection box can be closed with a lid.

In one embodiment, the connection box can be configured such that the side of the connection box facing the carrier or the frame is open at least in certain areas, so that the casting compound comes into contact with the carrier or the frame at the same time. In this way, the potting compound provides an adhesive connection between the connection box and the carrier and/or the frame, in particular a flexible, mechanical tension-compensating connection. An additional fixing of the connection box is then no longer necessary.

The connection box can be mounted directly on the frame or at a distance from the frame on the carrier. In the latter case, the frame can also be mounted after it has been attached and before or after the casting compound has been introduced into the connection box.

Another embodiment of the disclosure concerns a solar module system comprising the connection system described above. In addition, the solar module system has module electronics that are inserted into a socket of the connection box and electrically connected to the pins. In one embodiment the module electronics are in a flexible adhesive connection, for example formed by a double-sided adhesive ribbon, or a clamping connection with the frame and/or the carrier. The module electronics can be an inverter that converts the DC power of the solar module into AC power that can be fed into a grid, or a power optimizer that controls the solar characteristic curve in such a way that the solar module system delivers optimum power. However, the module electronics can also be a disconnecting device, for example, an isolating switch which can be controlled by means of an external control signal, so that in the event of danger, the solar module can be transferred into a safe state. In the simplest case, the module electronics only comprise bypass diodes.

In one embodiment, a housing of the module electronics is shaped in such a way that the module electronics and the connection box are completely accommodated by a recess formed by the frame and the carrier. In this way, the connection box and the module electronics in the solar module system are at the same time reliably mechanically stored, integrated in a visually appealing way and in the case of double-sided solar modules, also known as bifacial modules, it can be avoided that the module electronics or the connection box shade solar cells arranged on the carrier of the solar module. Double-sided solar modules are modules that generate electricity from both directions when irradiated, for example because the solar cells have photovoltaic cell structures on both their front and back sides and both the carrier and the top layer are transparent. In addition, effective heat dissipation of the module electronics can be achieved via an advantageous thermal coupling to the frame.

In addition, the frame can have a cover which protects the module electronics, the cables and/or the connectors from solar radiation and in particular also reduces the requirements for the UV resistance of the cable, the connectors or the housing of the module electronics. The cover can, for example, be formed by an extrusion press element that is clamped or clipped into the frame. A UV-resistant film is also conceivable.

BRIEF DESCRIPTION OF THE DRAWINGS:

In the following, the disclosure is represented with the help of figures of which

DETAILED DESCRIPTION

Figure 1:
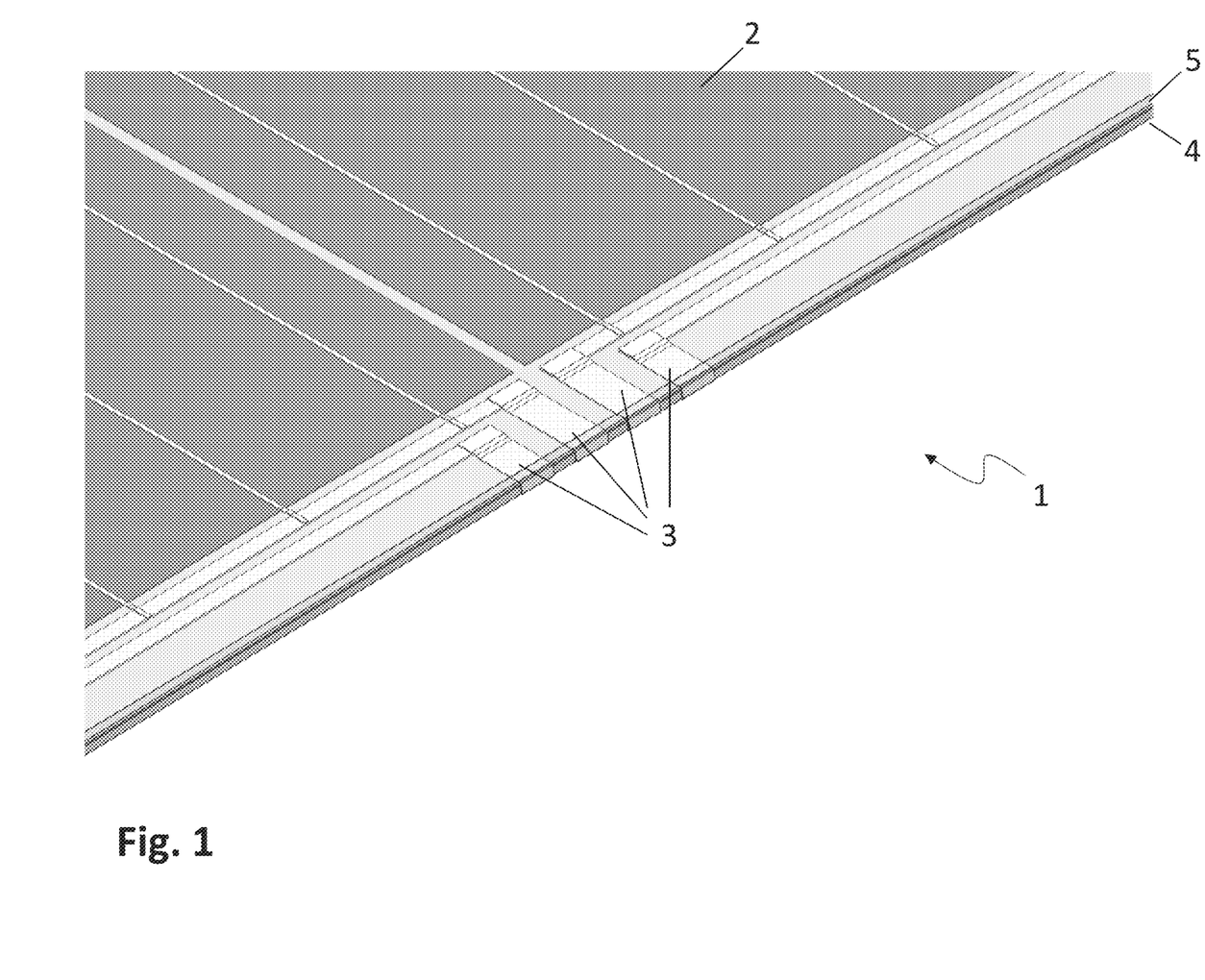
FIG. 1 shows a solar module according to the disclosure in a first manufacturing state.

FIG. 1 shows a solar module 1 in a first manufacturing state according to the disclosure. Solar cells 2 are arranged on a front side of a carrier 4 and electrically connected to each other. The solar cells 2 and the carrier 4 are covered by a transparent cover layer 5. The top layer can be formed as an EVA film (ethylene-vinyl acetate), which is applied to solar cells and substrates in a vacuum process and completely encapsulates the solar cells. Other transparent elements, such as a glass pane, can be arranged on this top layer 5. The top layer 5 may also be itself a pane of glass or comprise such a pane. The electrical connections to the solar cells 2 are formed by collecting lines which are electrically connected in an edge region of the carrier 4 to a plurality of ribbons 3, the ribbons 3 being arranged between the carrier 4 and the cover layer 5 and projecting beyond an edge of the carrier 4. The section of the ribbons 3 projecting beyond the edge of carrier 4 is bent around the edge of carrier 4 and extends to the back of carrier 4. In the example shown here, four ribbons 3 each provide the positive and negative potential of the series connection of the solar cells 2, as well as two intermediate potentials of this series connection. The carrier 4 is formed from an electrically insulating material, for example glass or ceramic, or comprises a conductive material, in which case the ribbons 3 are electrically insulated from the carrier 4, for example by arranging an electrically insulating foil between the carrier 4 and the ribbons 3. In one embodiment the ribbons 3 are formed from a flexible metal foil, in particular a copper foil. In one embodiment this copper foil is coated with tin.

Figure 2:
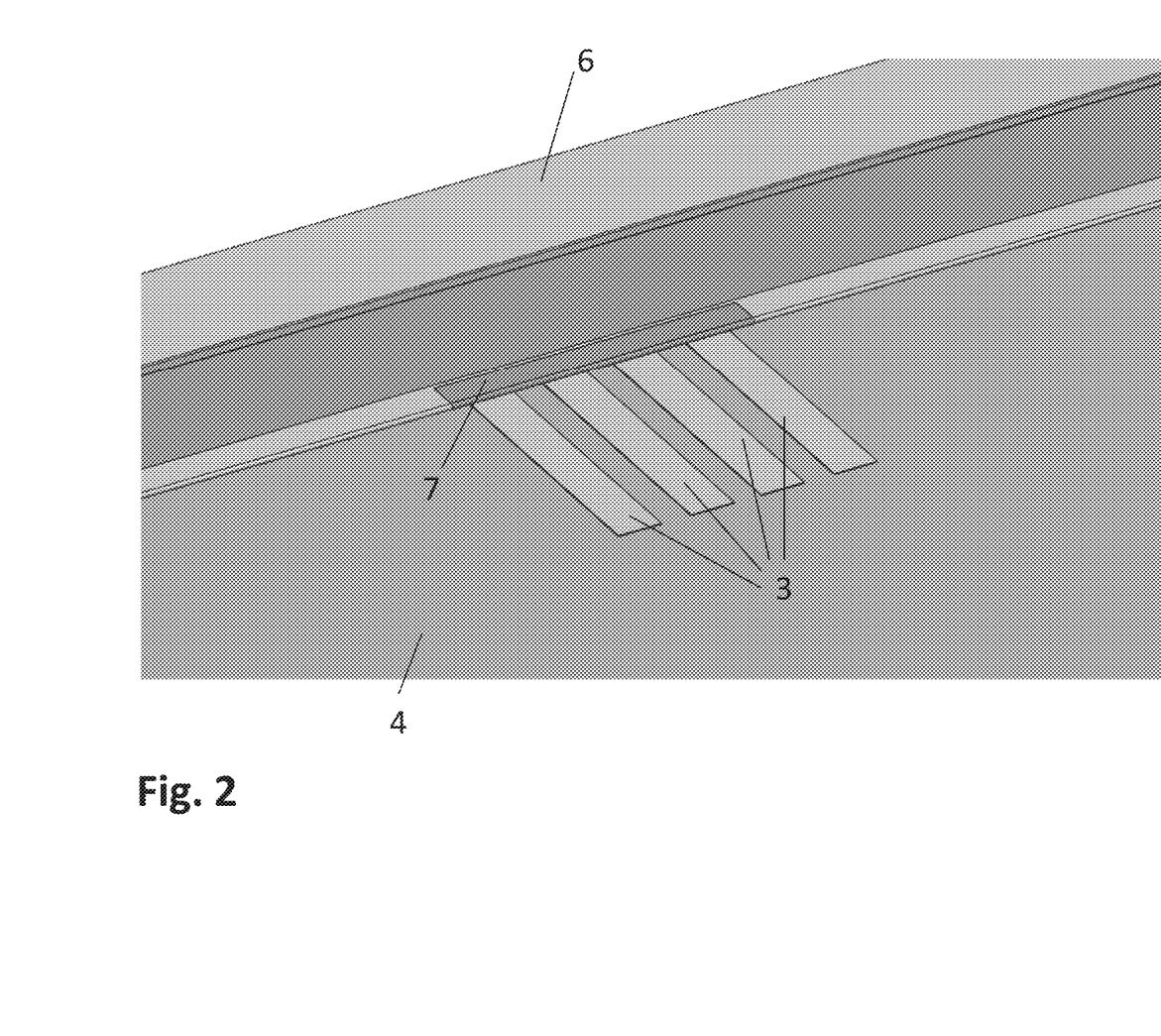
FIG. 2 shows a solar module according to the disclosure in a second manufacturing state.

FIG. 2 shows a second, later production state of the solar module 1, wherein the back side of the carrier 4 with the four ribbons 3 can now be seen. A frame 6 is attached to the edge of carrier 4, which is, in one embodiment, produced as a conductive frame, for example as an aluminum frame, especially as an extruded profile. In order to electrically insulate the ribbons 3 from the frame 6, an electrically insulating foil 7 is arranged between the two elements. The frame 6 extends along the circumference of the carrier 4 and forms a mounting element for further assembly of the solar module 1. To reduce mechanical stresses between the frame 6 and the carrier 4 of the solar module 1, a rubber lip not shown is arranged between the two, in one embodiment. The rubber lip, for example, is pushed circumferentially onto the edge of the carrier 4 with the cover layer 5, before the frame 6 is pushed onto the carrier 4 with the rubber lip as an insert. It is also conceivable that a rubber-like material is applied to the edge of the carrier in the liquid state, for example sprayed on. The rubber lip or the rubber-like material applied can at the same time also act as insulation between the frame 6 and the ribbons 3, so that in this case the electrically insulating foil 7 can be omitted.

Figure 3:
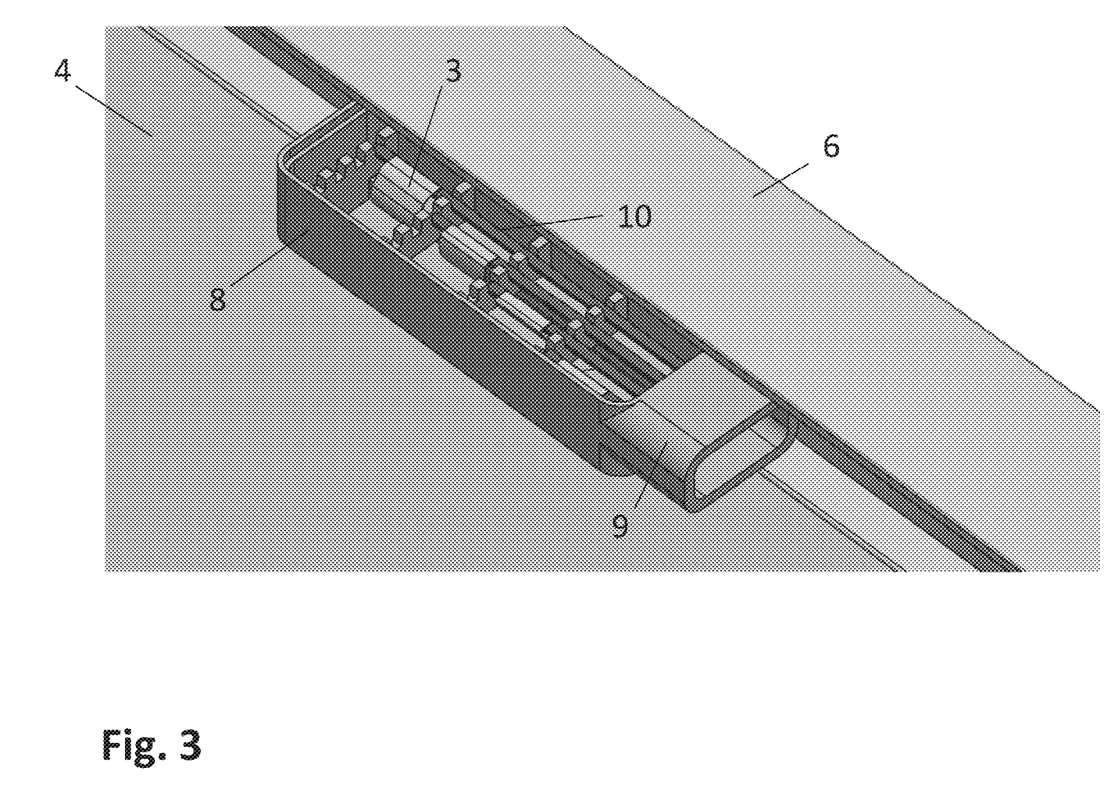
FIG. 3 shows a connection system according to the disclosure in a first manufacturing state.

Starting from the production status of FIG. 2, a connection box 8 can be placed in the area of ribbons 3 and fixed there, for example, temporarily, as illustrated in FIG. 3. The temporary fixing can be done for example with a double-sided adhesive ribbon or by clamping with the frame 6. The connection box is open on the side facing the ribbons 3 and on the side opposite this side. Four pins 10 are arranged inside the connection box 8. The pins 10 are mounted in webs which have corresponding cuts so that they are arranged parallel to each other and extend into the area of a socket 9 in which the pins 10 form electrical contacts of a male electrical plug connection, for example.

The ribbons 3 are bent towards one of the pins 10 and are electrically connected to this pin 10, for example by soldering, crimping, winding or bonding. After making the electrical connection, the ribbons 3 can be cut suitably. In this way, the electrical potentials of the solar cells 2 are available in socket 9 and can be further connected by inserting a plug into socket 9, for example an MCP plug (Multiple Contact Point) from Tyco. Such a connector type provides a particularly reliable, durable and at the same time cost-effective electrical connection with the solar cells 2.

Figure 4:
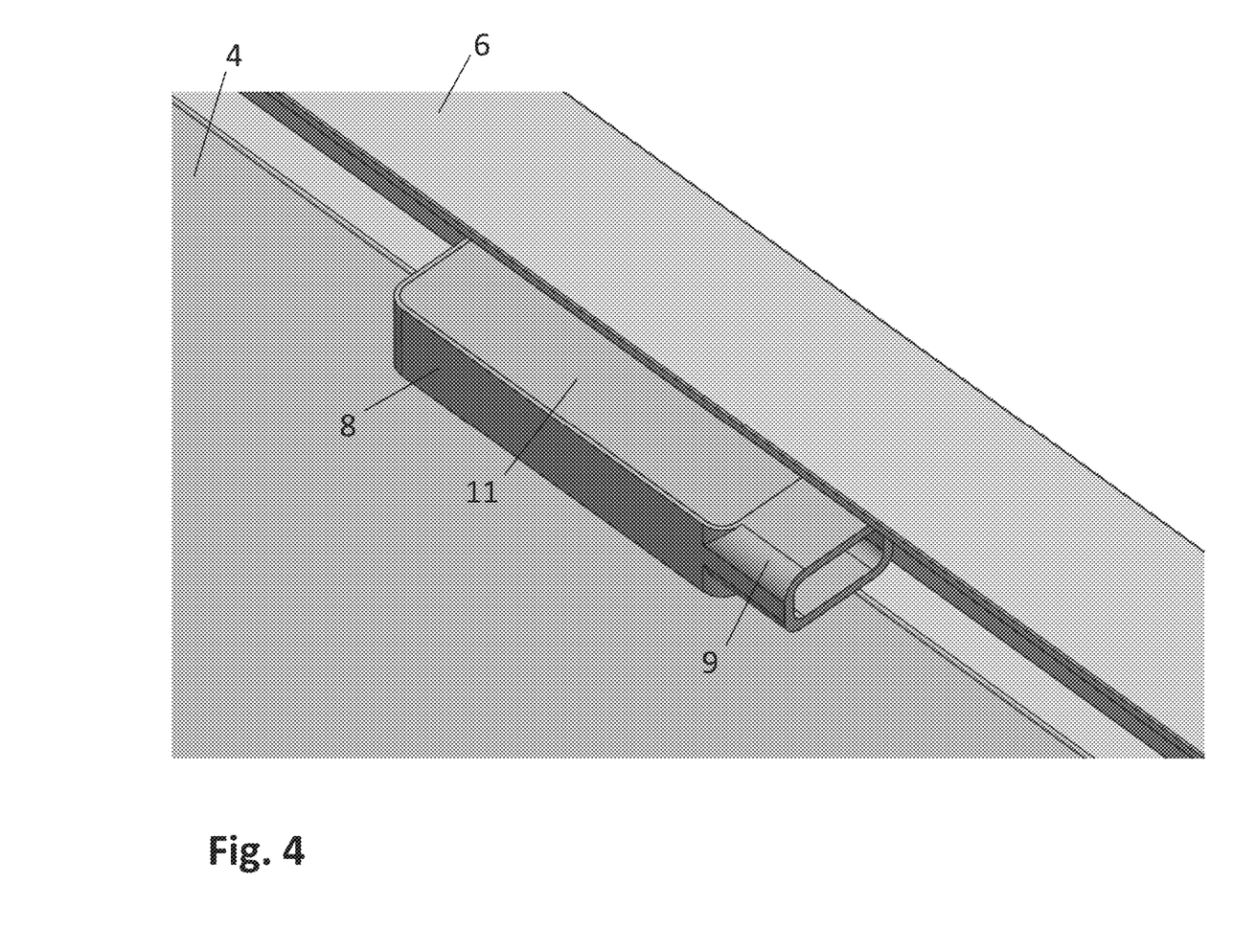
FIG. 4 shows a connection system according to the disclosure in a second manufacturing state, FIG. 5 a shows solar module system according to the disclosure.

After electrical connection of the ribbons 3 with the pins 10, the interior of the connection box 8 can be filled with an electrically insulating sealing compound, whereby in particular the ribbons 3 and pins 10 are completely embedded in the sealing compound. For this purpose, so-called Sikaflex is particularly suitable as a polyurethane-based potting compound, but other potting compounds such as silicone can also be used. Since the side of the connection box 8 facing the carrier 4 is open, the potting compound also provides a permanent mechanical connection between the connection box 8 and the carrier 4. Of course, the connection box 8 can also be arranged so close to the frame 6 that the open side of the connection box 8 covers the frame, so that it is also conceivable that a permanent mechanical connection between the connection box 8 and the frame 6 is made via the sealing compound. After casting, the connection box 8 can still be closed with a cover 11. This configuration of the connection system is shown in FIG. 4.

Figure 5:
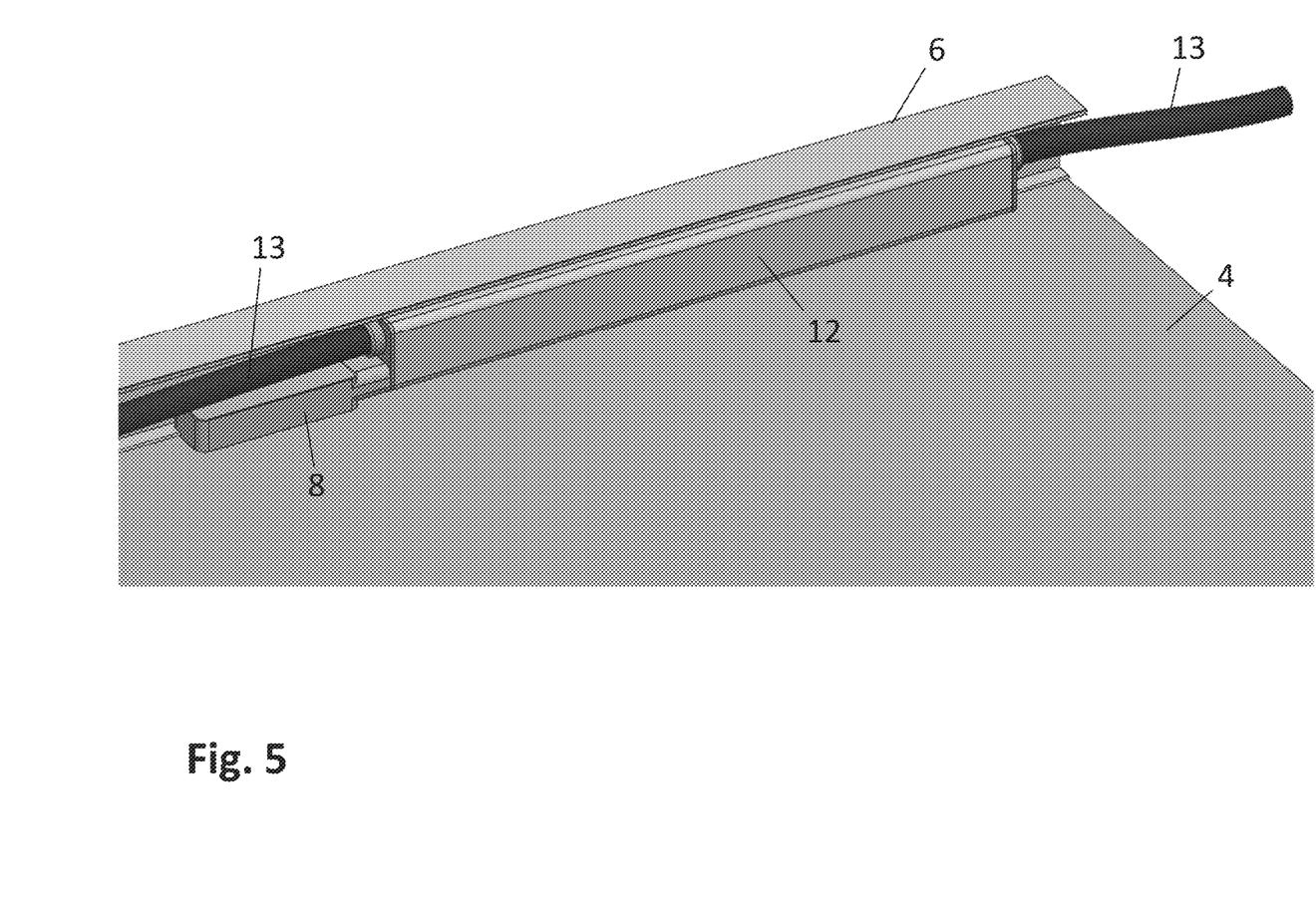

Module electronics 12 can easily be connected to the connection system described above by plugging it into socket 9 of connection box 8. FIG. 5 shows an example of such a solar module system. The module electronics 12 has an elongated design so that it substantially extends along frame 6. In this way, the inverter is efficiently cooled by the frame 6. The frame 6 also represents a mechanical fixation for the module electronics 12, which is glued to the frame 6 with double-sided adhesive ribbons, for example. Alternatively, the fixation can also be carried out in the same way with carrier 4. Heat dissipation from the module electronics 12 via frame 6 is also advantageous over heat dissipation via carrier 4 because frame 6 has a significantly lower temperature when exposed to sunlight, in extreme cases it can be more than 20° C. colder. This does not even require direct contact of the module electronics 12 with the frame 6 if enough heat is already transferred to the frame 6 by radiation or convection. Experience has shown that this is still the case with a distance between the frame and the module electronics of up to 1 mm.

In one embodiment, the design of the module electronics 12 is selected in such a way that it is completely accommodated in a recess formed by the frame in connection with the carrier 4. Furthermore, in one embodiment the cables 13 are routed along the frame 6 within this recess. This not only achieves a visually smooth integration of the module electronics 12 into the solar module system, but also, in the case of solar modules which have 4 solar cells on both sides of the carrier, yield advantages are achieved by preventing parts of the solar cells from being shaded by the module electronics 12 or the cables 13. In addition, a larger area of the solar module 1 can be filled with solar cells 2.

In the example shown in FIG. 5, the module electronics 12 is an inverter in which cables 13 are led out of the housing at opposite ends, which in this case enable a connection to the AC grid or to other inverters. The inverter is, in one embodiment, configured as an electrically isolating inverter, which means that the requirements for the insulation properties of the connection system are low. For example, it may be sufficient that only potential differences of, for example, 100 V within the solar module must be safely isolated from each other.

Instead of an inverter, the module electronics 12 can also have a power optimizer or a disconnecting device, which can be controlled in particular via an external control signal.

Figure 6:
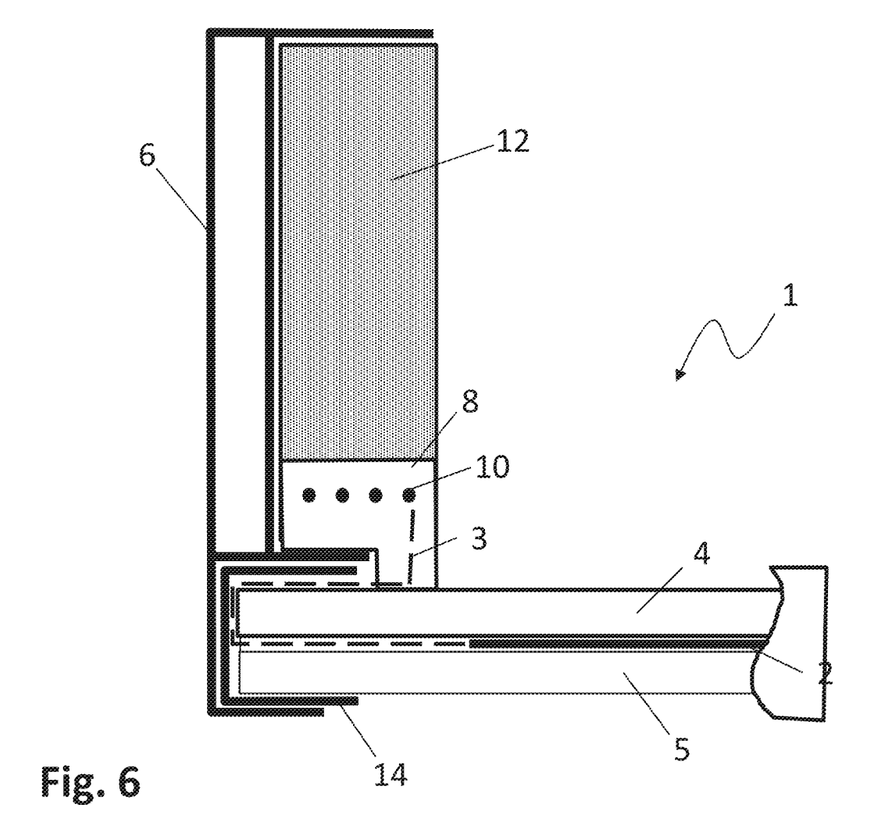
FIG. 6 shows a cross-section through a section of a solar module system.

FIG. 6 shows a cross-section through a section of a solar module system according to the disclosure in order to demonstrate the arrangement of the individual elements of the solar module system. A solar module 1 is mounted in a first, lower recess of a frame 6. An inlay 14, for example a rubber lip, ensures a secure and low-tension mounting of the solar module 1 in the recess. Here it was assumed that the inlay 14 ensured sufficient electrical insulation of the ribbons 3 against the frame 6, therefore the insulating foil 7 shown in FIG. 2 was omitted, which would otherwise have to be placed between frame 6 and inlay 14.

In this example, solar module 1 is configured as a double-sided solar module, in which a solar cell 2, which generates electricity when irradiated on both sides, is arranged on a transparent carrier 4, in particular a glass plate, and is covered with a further glass plate as cover layer 5. The solar cell 2 is laminated with an EVA film on the carrier 4 or on the top layer 5, so that the EVA film is arranged between the solar cell 2 and one of the glass plates forming the carrier and top layer.

In a second, upper recess of frame 6 there is a connection box 8 and a module electronics 12 behind it. A ribbon 3 for the electrical connection of the solar cells on the front runs from the solar cells 2 around an edge of the carrier 4 to the rear of the solar module 1 and is bent inside the connection box 8 to one of the pins 10 and electrically connected to it. The other ribbons are outside the cross section and are therefore not shown. The module electronics 12 and the connection box 8 have a width which is less than or equal to the width of the end web of frame 6 shown as the upper web in the cross-section of FIG. 6. In this way, the module electronics 12 and the connection box 8 are completely or substantially completely accommodated in the second, upper recess, so that no shadows are cast on the solar cells 2 of the rear of the carrier 4 when the light falls vertically on them, and so that the energy yield of the solar module 1 is not impaired. The cables 13 that are not shown can also run inside this recess along frame 6 and do not shade the solar cells 2 at vertical light incidence.

The invention claimed is:

1. A solar module system, comprising:
 a connection system, comprising:
  a solar module, comprising:
   a plurality of solar cells arranged on a front side of a carrier of the solar module,
   wherein a plurality of conductive ribbons electrically contacts the solar cells and extends from the front side to a rear side of the carrier by projecting beyond an edge of the carrier, wherein a section of the conductive ribbons projecting beyond the edge of the carrier is bent around the edge of the carrier to extend to the rear side of the carrier, and
  wherein the carrier is surrounded circumferentially by a frame of the solar module; and
  a connection box arranged on the rear side of the carrier, wherein the connection box comprises a plurality of pins arranged parallel to one another, wherein the plurality of pins have different lengths, and wherein in each case a respective ribbon of the plurality of conductive ribbons is electrically and physically directly connected to one pin of the plurality of pins, wherein the connection box comprises a socket that houses the plurality of pins; and
 module electronics comprising an elongated housing, wherein the module electronics comprises an inverter, wherein the module electronics is inserted with its housing into the socket of the connection box and electrically connected to and physically engaging the pins so as to form a rigid connection between the connection box and the module electronics, wherein the connection box and the module electronics are completely accommodated in a recess of the frame of the solar module wherein the connection box comprises webs in which the plurality of pins are stored in cuts in the webs, and wherein between connecting areas of neighboring conductive ribbons, there is one such web each.

2. The solar module system according to claim 1, wherein the module electronics comprises a flexible adhesive connection or a clamping connection with the frame and/or the carrier.

3. The solar module system according to claim 1, wherein the conductive ribbons are formed from a flexible metal foil.

4. The solar module system according to claim 1, wherein the frame is attached to the edge of the carrier, and wherein an electrically insulating foil is arranged between the frame and the conductive ribbons.

5. The solar module system according to claim 1, wherein the connection box is filled with a sealing compound in such a way that the electrical connections between respective conductive ribbons and respective pins are completely embedded in the sealing compound, and wherein the connection box has an opening facing the carrier or the frame, or both, and the sealing compound provides a flexible adhesive connection between the connection box and the carrier and/or the frame, respectively.

6. The solar module system according to claim 1, wherein the plurality of pins have a staggered length.

7. The solar module system according to claim 6, wherein the connection box is placed over the conductive ribbons and for each pin one ribbon is bent up to the associated pin and at least partially wound around the associated pin.

* * * * *